United States Patent
Hung et al.

(10) Patent No.: US 8,653,694 B2
(45) Date of Patent: Feb. 18, 2014

(54) JUNCTION BOX

(75) Inventors: Tsung-Liang Hung, Jhongli (TW); Chih-Chan Ger, Jhongli (TW)

(73) Assignee: Ampower Technology Co., Ltd., Jhongli, Taoyuan County (TW)

( * ) Notice: Subject to any disclaimer, the term of this patent is extended or adjusted under 35 U.S.C. 154(b) by 530 days.

(21) Appl. No.: 12/941,090

(22) Filed: Nov. 8, 2010

(65) Prior Publication Data
US 2012/0055529 A1 Mar. 8, 2012

(30) Foreign Application Priority Data
Sep. 2, 2010 (CN) .......................... 2010 1 0270748

(51) Int. Cl.
H02J 1/00 (2006.01)
H02J 3/00 (2006.01)

(52) U.S. Cl.
USPC .......................................................... 307/77

(58) Field of Classification Search
USPC ........................ 307/77, 139, 140, 80, 82, 85
See application file for complete search history.

(56) References Cited

U.S. PATENT DOCUMENTS

| | | | | |
|---|---|---|---|---|
| 6,201,319 B1 * | 3/2001 | Simonelli et al. | ................ | 307/26 |
| 7,082,019 B2 * | 7/2006 | Bodeau et al. | .................. | 361/82 |
| 8,433,530 B2 * | 4/2013 | Shimada et al. | ................ | 307/11 |
| 2009/0159113 A1 | 6/2009 | Morimoto | | |
| 2011/0031814 A1 * | 2/2011 | Giesler | ........................... | 307/77 |

FOREIGN PATENT DOCUMENTS

CN 200941388 8/2007
TW M359146 6/2009

* cited by examiner

*Primary Examiner* — Carlos Amaya
(74) *Attorney, Agent, or Firm* — Altis Law Group, Inc.

(57) ABSTRACT

A junction box connected to a plurality of solar cell panels connected in series and under control a control device, includes a plurality of diodes, two ports, a switch, and a communication module. The plurality of diodes is forwardly connected in series to form a diode string with two ends, and each of the plurality of diodes is electrically connected to a corresponding one of the plurality of solar cell panels in parallel. The two ports are respectively connected to the two ends of the diode string and the plurality of solar cell panels, and output DC power of the plurality of solar cell panels. The switch is connected between the diode string and the two ports. The communication module is connected to the switch, and receives control signals from the control device to turn on or off the switch to control output of the DC power of the solar cell panels from the two ports.

5 Claims, 7 Drawing Sheets

JUNCTION BOX

BACKGROUND

1. Technical Field

The disclosure relates to solar power systems and particularly to a junction box.

2. Description of Related Art

In solar power systems, a plurality of photovoltaic (PV) modules, each of which including a plurality of solar cells, are connected in series to provide power via a direct current (DC) bus. When there is a problem in the solar power systems, which causes a malfunction, the plurality of PV modules still provide power to the DC bus. That is, the DC bus is still electrified, which is dangerous for operators.

DETAILED DESCRIPTION

As used herein, the term "solar cell" is defined to be a device that converts energy of sunlight directly into direct current (DC) power. Assemblies of solar cells are used to make "solar cell panels". The term "photovoltaic module" is defined to be an assembly of solar cell panels. An inverter is a device that converts DC power into alternating current (AC) power. The term "junction box" is defined to be a container in a photovoltaic module for electrical connections, especially for electrical connections of solar cell panels, usually intended to conceal electrical connections from sight and deter tampering.

Figure 1:
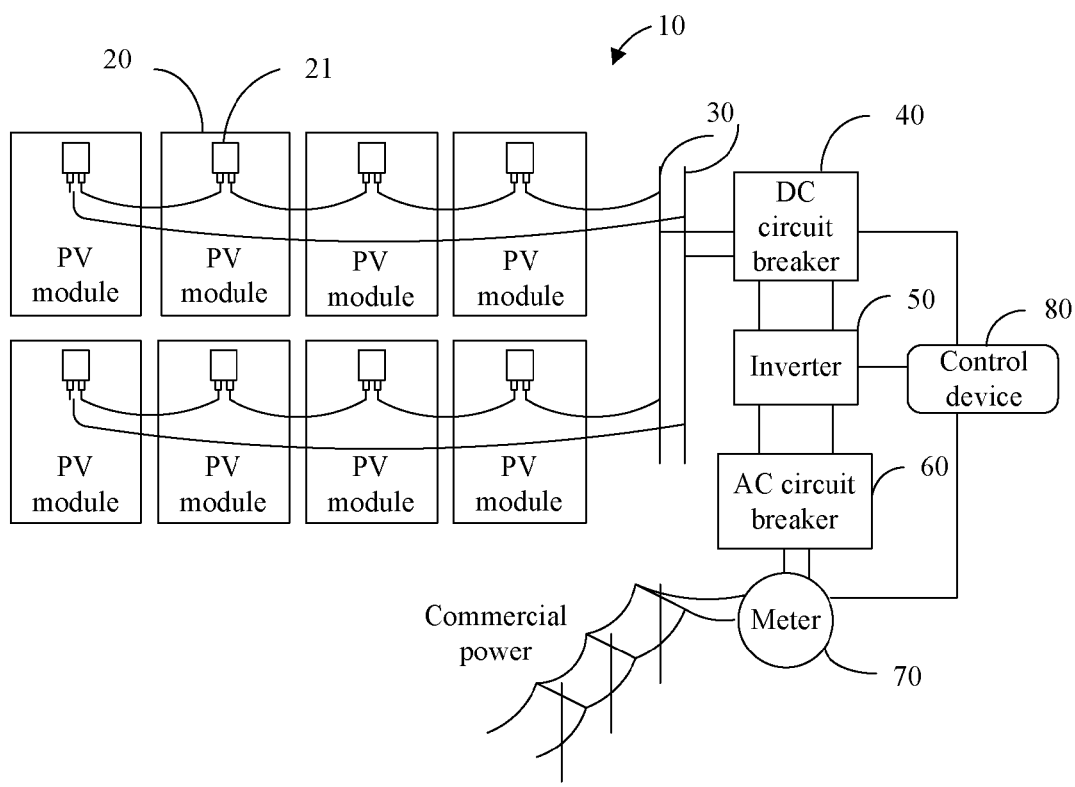
FIG. 1 is a schematic diagram of one embodiment of a solar power system.
Figure 2:
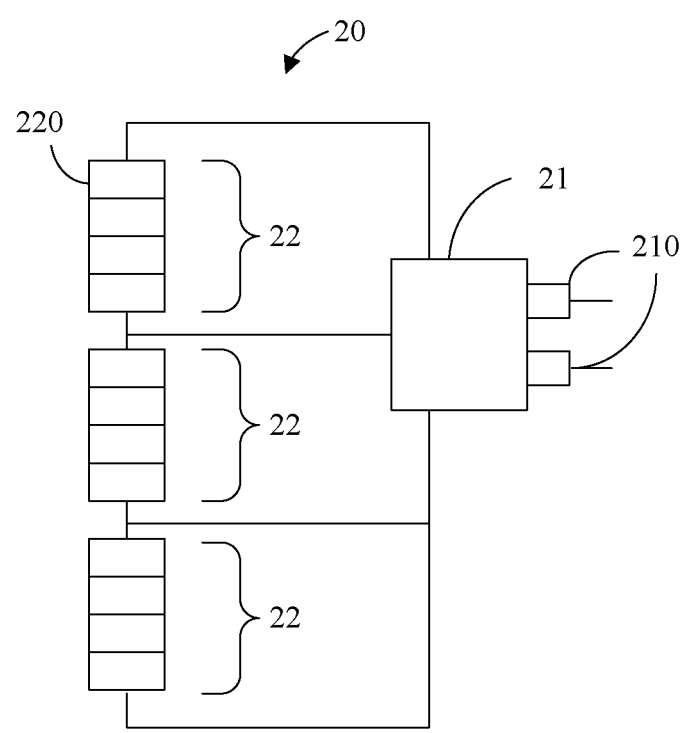
FIG. 2 is a schematic diagram of one embodiment of a photovoltaic module.

FIG. 1 is a schematic diagram of one embodiment of a solar power system 10. In one embodiment, the solar power system 10 includes a plurality of photovoltaic (PV) modules 20, a DC bus 30, a DC circuit breaker 40, an inverter 50, an AC circuit breaker 60, a meter 70, and a control device 80. As shown in FIG. 2, each PV module 20 includes a plurality of solar cell panels 22 connected in series and a junction box 21. The plurality of solar cell panels 22 of each PV module 20 convert energy of sunlight directly into DC power, and transmit the DC power to the DC bus 30 via the corresponding junction box 21. The control device 80 controls the plurality of PV modules 20, the DC circuit breaker 40, the inverter 50, and the meter 70.

The DC circuit breaker 40 is connected between the DC bus 30 and the inverter 50, and is controlled to be turned on or turned off by the control device 80 to control DC power flowing from the DC bus 30 to the inverter 50. The inverter 50 converts the DC power into AC power. The AC circuit breaker 60 is connected between the inverter 50 and the meter 70, and is turned on or off to control the AC power flowing from the inverter 50 to the meter 70. The meter 70 distributes different commercial power to users under control of the control device 80.

FIG. 2 is a schematic diagram of one embodiment of the PV module 20. In one embodiment, the PV module 20 includes the plurality of solar cell panels 22 (only three shown in FIG. 2) connected in series and the junction box 21. Each solar cell panel 22 includes a plurality of solar cell 220 connected in series and two ports. The junction box 21 is connected to the plurality of solar cell panels 22, and transmits the DC power of the plurality of solar cell panels 22 to the DC bus 30, and is under control of the control device 80. The junction box 20 includes two ports 210 to output the DC power.

In one embodiment, the junction box 20 is connected to both ports of each solar cell panel 22. For example, if the PV module 20 includes two solar cell panels 22 connected in series, each of the two solar cell panels 22 has a port connected to a port the other solar cell panel 22 (hereinafter called "connected port") and a port not connected to the other solar cell panel 22 (hereinafter called "non-connected port"), the junction box 20 is connected to two non-connected ports of the two solar cell panels 22 respectively via two cables and connected to two connected ports of the two solar cell panels 22 via one cable. Similarly, if the PV module 20 includes three solar cell panels 22 connected in series, the junction box 20 is connected to the three solar cell panels 22 via four cables. In summary, the junction box 20 is connected to n solar cell panels 22 via n+1 cables.

Figure 3:
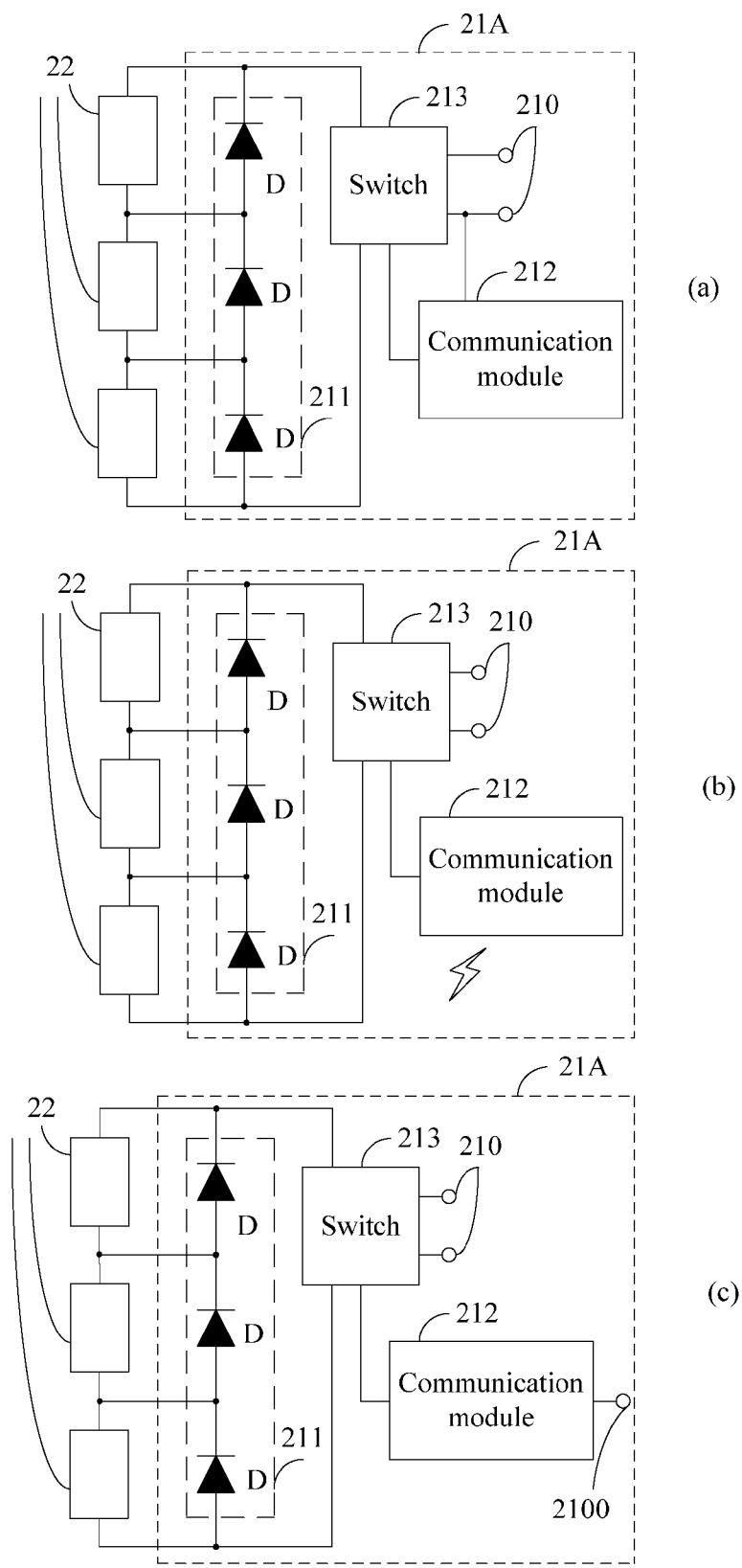
FIG. 3 is a schematic diagram of a first embodiment of a junction box as disclosed.

FIG. 3 is a schematic diagram of a first embodiment of a junction box 21A as disclosed. In the first embodiment, the junction box 21A includes a diode string 211, two ports 210, a communication module 212, and a switch 213. The diode string 211 includes a plurality of diodes D forwardly connected in series, and has two ends. The plurality of diodes D and the plurality of solar cell panels 22 have the same number of units, and one diode D is electrically connected to a corresponding solar cell panel 22 in parallel. Thus, when one solar cell panel 22 is abnormal, the corresponding diode D turns on to bypass the abnormal solar cell panel 22. In one embodiment, a cathode of a diode D is connected to a positive port of the corresponding solar cell panel 22, an anode of the diode D is connected to a negative port of the corresponding solar cell panel 22. When the solar cell panel 22 is normal, voltage on the cathode is higher than that on the anode of the diode D, and the diode D is turned off. When the solar cell panel 22 is abnormal, the anode of the corresponding diode D is connected to the positive port of a following solar cell panel 22, and the cathode of the corresponding diode D is connected to the negative port of a previous solar cell panel 22. Thus the corresponding diode D is turned on to maintain output of the DC power of other solar cell panels.

The two ports 210 of the junction box 21A are respectively connected the two ends of the diode string 211, where the port 210 connected to one end of the cathode of the diode string 211 is a positive port, and the port 210 connected to one end of the anode of the diode string 211 is a negative port. That is, the positive port 210 is connected to the positive port of a first solar cell panel 22, and the negative port 210 is connected to the negative port of a last solar cell panel 22. The switch 213 is connected between the diode string 211 and the two ports 210. In one embodiment, the switch 213 may be transistors or relays.

The communication module 212 is connected to the switch 213, and receives control signals from the control device 80 to turn on or off the switch 213 to control output of the DC power of the plurality of the solar cell panels 22 from the ports 210. In one exemplary embodiment, as shown is FIG. 3(a), the communication module 212 is connected to the ports 210, and communicates with the control device 80 via the ports 210, the DC bus 30 and the DC circuit breaker 40. In another exemplary embodiment, as shown in FIG. 3(b), the communication module 212 may be a wireless communication module, and communicates with the control device 80 wirelessly via wireless communication standards, such as, wifi or Zigbee. In a further exemplary embodiment, as shown in FIG. 3(c), the junction box 21A further includes a communication interface 2100 connected to the communication module 212 and the control device 80, and the communication module 212 communicates with the control device 80 via the communication interface 2100. The control signals includes identifications of the junction boxes 21A, thus, the junction boxes 21A can independently receive corresponding control signals and be controlled by the corresponding control signals. The control signals may be high or low level logic signals to turn on or off the switch 213.

In one embodiment, if the communication module 212 receives no control signals from the control device 80, the junction box 21A does not output the DC power of the solar cell panels 22. When the communication module 212 receives control signals from the control device 80, the communication module 212 control the switch 213 to turn on or off according to the received control signals, thereby controlling output of the DC power of the solar cell panels 22.

Figure 4:
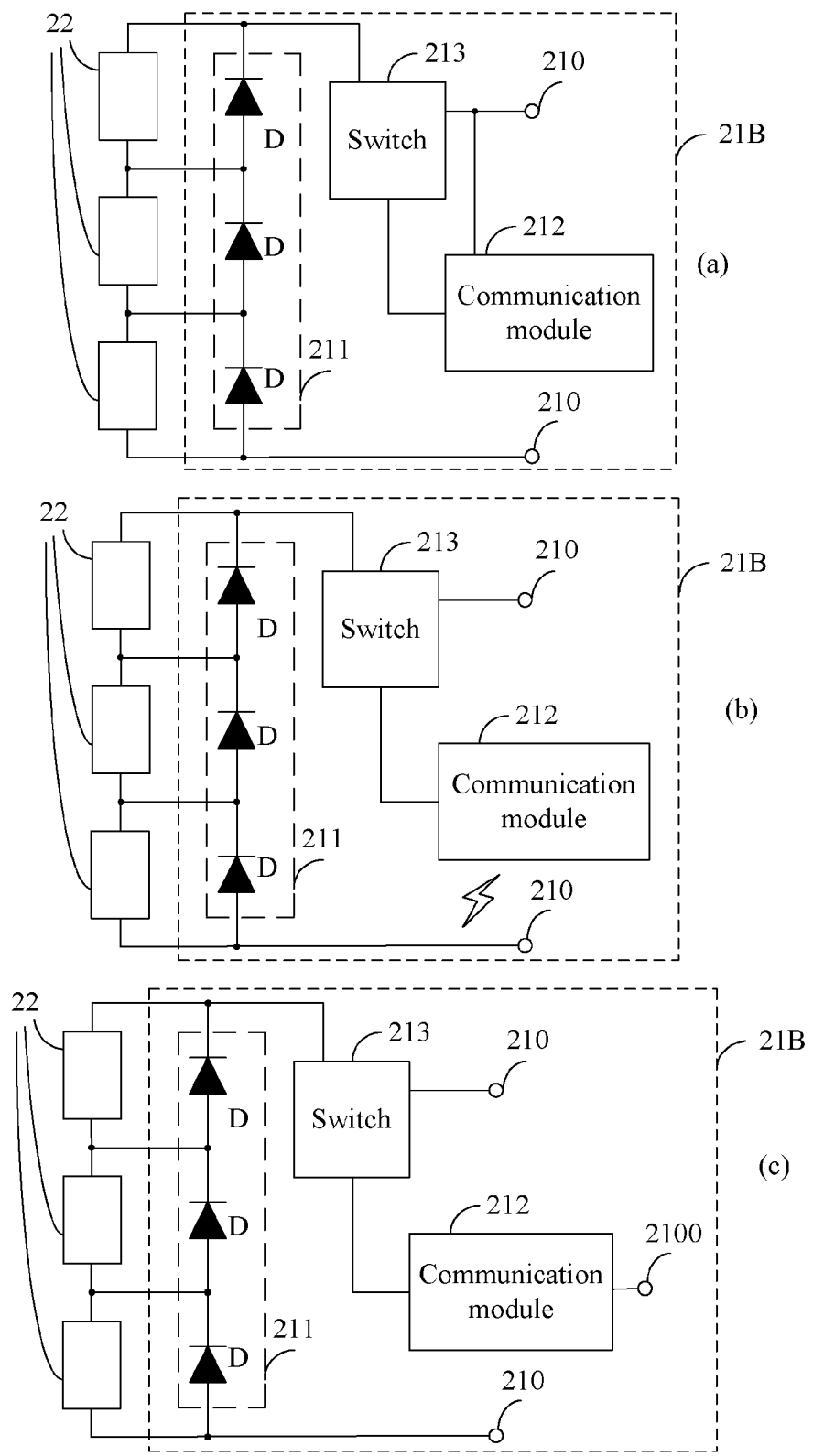
FIG. 4 is a schematic diagram of a second embodiment of a junction box as disclosed.

FIG. 4 is a schematic diagram of a second embodiment of a junction box 21B as disclosed. The junction box 21B has similar structures to that of FIG. 3 except for connection of the switch 213. In this embodiment, the switch 213 is connected between one end of the diode string 211 and a corresponding port 210, especially between a cathode end of the diode string 211 and the positive port 210. If the control device 80 needs the DC power of the plurality of solar cell panels 22 to output, the communication module 212 receives the control signals, and controls the switch 213 to turn on to output the DC power of the solar cell panels 22 from the ports 210. If the control device 80 needs the DC power of the plurality of solar cell panels 22 not to output, the communication module 212 controls the switch 213 to turn off not to output the DC power of the solar cell panels 22 from the ports 210.

Figure 5:
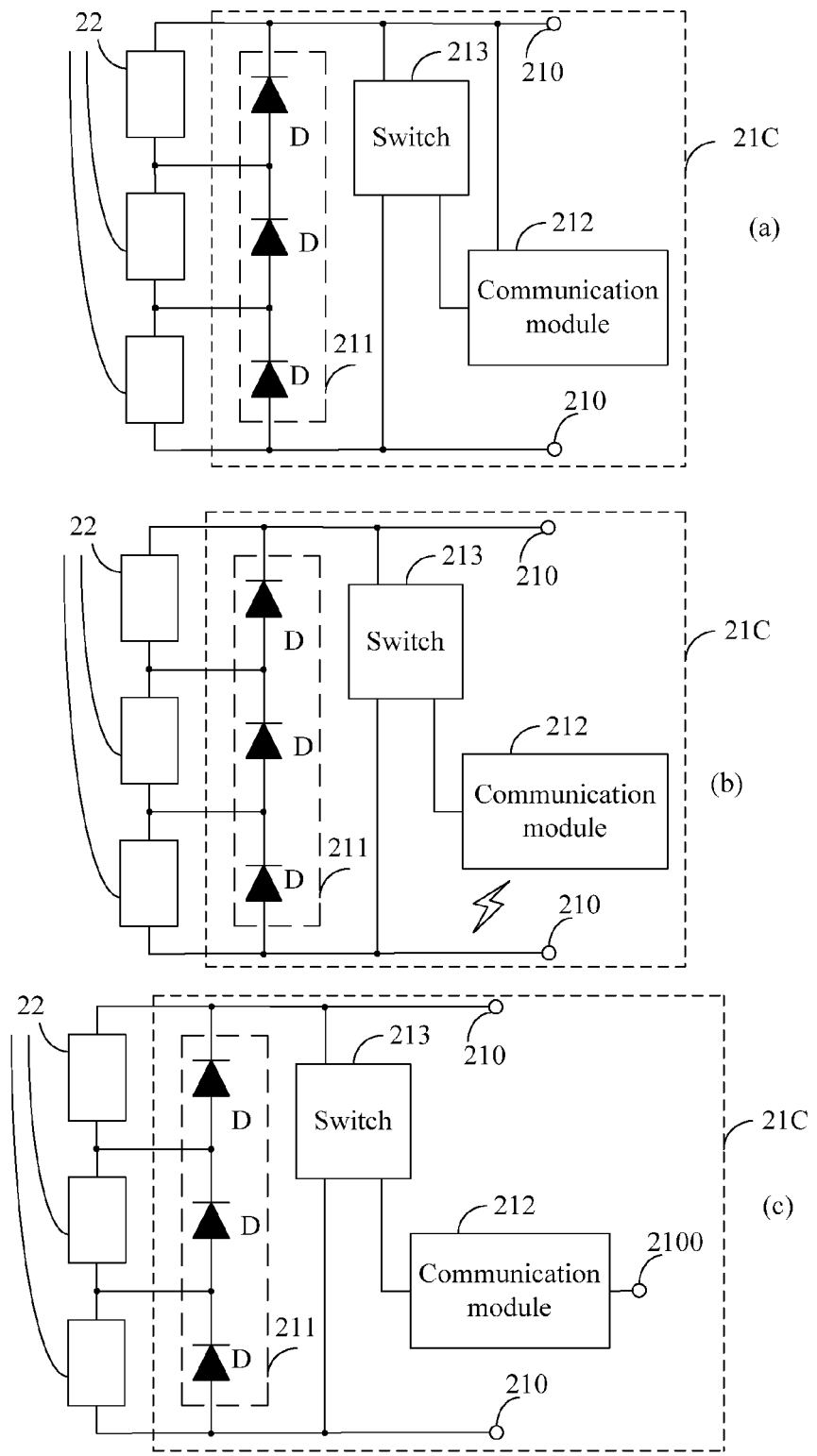
FIG. 5 is a schematic diagram of a third embodiment of a junction box as disclosed.

FIG. 5 is a schematic diagram of a third embodiment of a junction box 21C as disclosed. The junction box 21C has similar structures to that of FIG. 3 except for connection of the switch 213. In this embodiment, the switch 213 is connected to the diode string 211 in parallel. If the control device 80 needs the DC power of the plurality of solar cell panels 22 not to output, the communication module 212 receives the control signals, and controls the switch 213 to turn on to bypass the ports 210, thereby no DC power of the solar cell panels 22 output from the ports 210. If the control device 80 needs the DC power of the plurality of solar cell panels 22 to output, the communication module 212 controls the switch 213 to turn off to output the DC power of the solar cell panels 22 from the ports 210.

When the solar power system 10 is abnormal, such as, the commercial power is off or there is a fire in the solar power system 10, or the solar power system 10 needs to be examined and repaired, the control device 80 sends the control signals to the junction boxes 21A, 21B, and 21C of FIGS. 3 to 5, to control the switch 23 to turn on or off, thereby controlling the output of the DC power of the solar cell panels 22. Thus, it is convenient for manage the junction boxes 21A, 21B, and 21C and insures safety of the solar power system 10 and operators.

Figure 6:
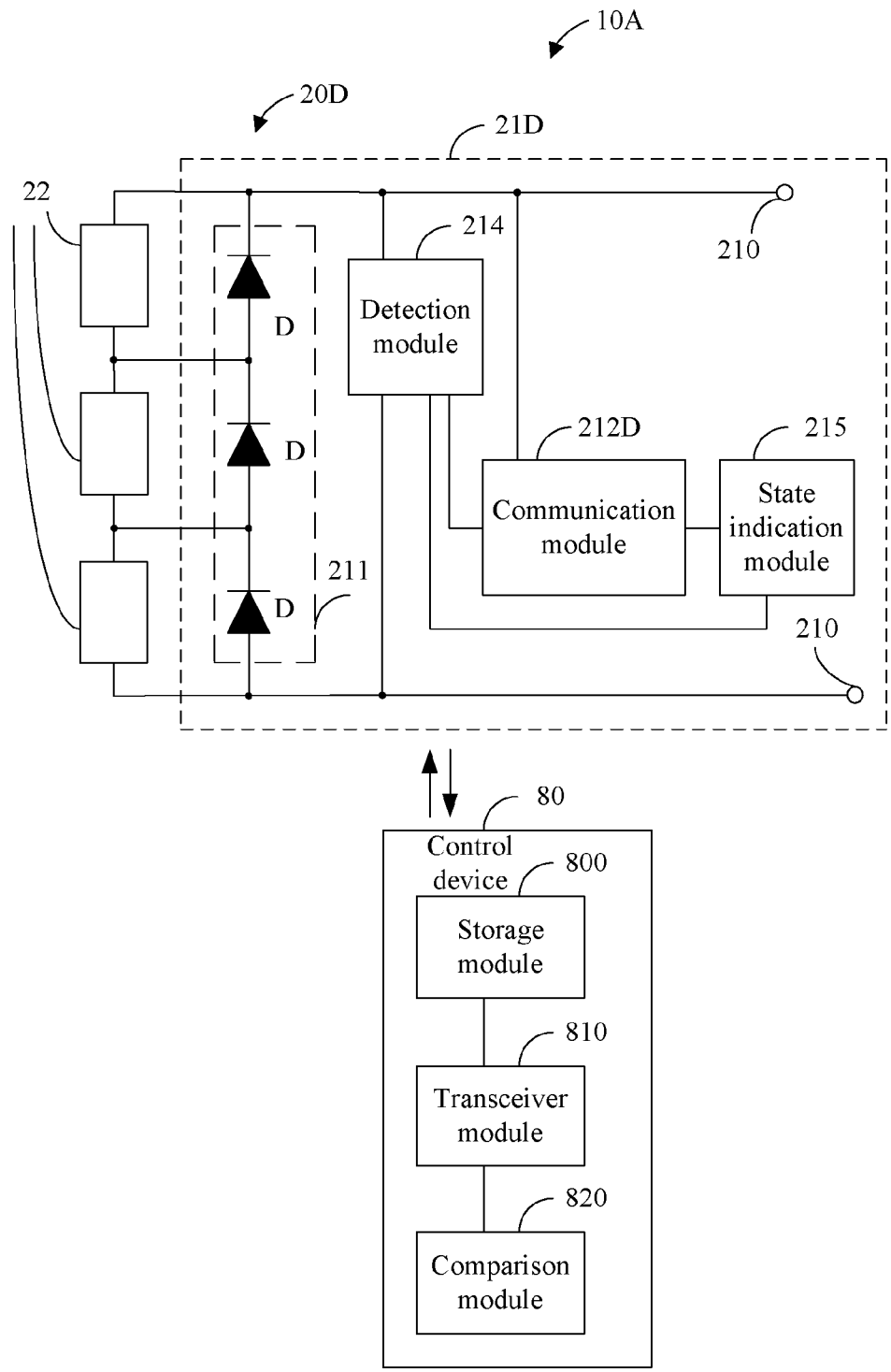
FIG. 6 is a schematic diagram of one embodiment of a solar power system.

FIG. 6 is a schematic diagram of one embodiment of a solar power system 10A as disclosed. In one embodiment, the solar power system 10A includes a plurality of PV modules 20D (only one shown) and the control device 80, and detects and determines if the plurality of PV modules 20D are normal. Each of the plurality of PV modules 20D includes a junction box 21D and the plurality of solar cell panels 22. The junction box 21D includes the two ports 210, the diode string 211, a communication module 212D, a detection module 214, and a state indication module 215. The ports 210 and the diode string 211 of the junction box 21D are similar to those of FIGS. 3 to 5, therefore descriptions are omitted here.

The detection module 214 is connected to the diode string 211, the ports 210, the communication module 212D, and the state indication module 215, detects parameters of the corresponding PV module 20D, and generates a reporting signal. In one embodiment, the parameters of the corresponding PV module 20D include voltage or current or a combination of voltage and current or temperature of the PV module 20D. The detection module 214 detects voltage or current of the plurality of solar cell panels 22 connected in series to retrieve the voltage or current of the corresponding PV module 20D, and detects temperature of the junction box 21D to retrieve the temperature of the corresponding PV module 20D. The reporting signal includes the parameters and an identification of the corresponding PV module 20D, such as a sequence number of the corresponding PV module 20D. In one embodiment, the detection module 214 detects according to a predetermined period, for example fifteen minutes, to save power, and the predetermined period can be set according to actual needs.

The communication module 212D transmits the reporting signal to the control device 80 according to a predetermined manner. In one embodiment, the predetermined manner includes a fixed period. That is, the communication module 212D transmits the reporting signal to the control device 80 according to the fixed period, such as, fifteen minutes, to save power. In another embodiment, the predetermined manner includes that the communication module 212D transmits the reporting signal only when the parameters of the PV module 20D detected by the detection module 214 change. In a further embodiment, the predetermined manner includes the fixed period and data quantum, that is, the communication module 212D transmits the reporting signal according to the fixed period and the data quantum. For example, if there is more data quantum, the communication module 212D transmits the reporting signal via a short period. If there is less data quantum, the communication module 212D transmits the reporting signal via a long period.

Similar to that of FIGS. 3(b), 4(b), and 5(b), the communication module 212D may be a wireless communication module wirelessly communicating with the control device 80 via the wireless communication standards, such as, wifi or Zigbee. In an alternative embodiment, similar to that of FIGS. 3(a), 4(a), and 5(a), the communication module 212D may be connected to the ports 210 to communicate with the control device 80 via the DC bus 30 and the DC circuit breaker 40. In a further embodiment, similar to that of FIGS. 3(c), 4(c), and 5(c), the junction box 21D may include the communication interface 2100 connected to the control device 80, and the communication module 212D may communicate with the control device 80 via the communication interface 2100.

In one embodiment, the control device 80 determines if the plurality of PV modules 20D are abnormal, and includes a storage module 800, a transceiver module 810, and a comparison module 820. The storage module 800 saves an amount of the plurality of PV modules 20D in the solar power system 10A, and the amount is input by managers or operators. The transceiver module 810 receives the reporting signals from the plurality of junction boxes 21D of the plurality of PV modules 20D, and sends the reporting signals to the comparison module 820. The comparison module 820 compares the stored amount of the plurality of PV modules 20D with an amount of the received reporting signals, to determine if the plurality of PV modules 20D are abnormal. If the stored amount of the plurality of PV modules 20D is the same as the amount of the received reporting signals, the comparison module 820 determines the plurality of PV module 20D are all normal. If the stored amount of the plurality of PV modules 20D is different from the amount of the received reporting signals, it indicates that some PV modules 20D do not report and may be abnormal, and the comparison module 820 determines there are some abnormal PV modules 20D in the solar power system 10A.

The comparison module 820 further generates a state indication signal according to the determination. In one embodiment, the state indication signal indicates that the corresponding PV module 20D is normal. The transceiver module 810 transmits the state indication signal to corresponding junction boxes 21D according to the identifications of the corresponding PV module 20D in the received reporting signals. In one embodiment, the state indication signal may be a high or low level logic signal, and may have same format with that of the control signals but with some different fields. In alternative embodiments, the state indication signal may have different format with that of the control signals.

The communication module 212D further receives the state indication signal from the control device 80, and the state indication module 215 indicates a state of the corresponding PV module 20D according to the state indication signal. In an exemplary embodiment, the state indication module 215 indicates a normal state of the corresponding PV module 20D. In one embodiment, the state indication module 215 may be a light emitting diode. When the control device 80 receives the reporting signals, the control device 80 determines that the PV modules 20 transmitting the reporting signals are normal, and generates and transmits the state indication signal to the PV modules 20 transmitting the reporting signals. The PV modules 20 transmitting the reporting signals indicate the normal state according to the state indication signal. The abnormal PV modules 20 transmit and receive no signals, so do not indicate.

The storage module 800 further stores a normal range of the parameters of the plurality of PV modules 20D, and the normal rang of the parameters is input by the managers or operators. The comparison module 820 further compares the stored normal range of the parameters with the parameters in the reporting signals, to further determine if the plurality of PV modules 20D are normal. If the parameters in the reporting signals are not consistent with the stored normal range of the parameters, the corresponding PV modules 20D are abnormal, for example, being dirty. If the parameters in the reporting signals are consistent with the stored normal range of the parameters, the comparison module 820 determines the corresponding PV modules 20D are normal.

In alternative embodiment, the detection module 214 further determines if the detected parameters are normal, and directly controls the state indication module 215 to indicate.

The solar power system 10A compares the stored amount of the plurality of PV modules 20D with the amount of the reporting signals to determine if the plurality of PV modules 20D are abnormal, which has a simple structure and can be easily achieved. In addition, the control device 80 transmits the state indication signal to normal PV modules 20D to indicate the normal state, which is convenient for the operators to find the abnormal PV modules 20D.

Figure 7:
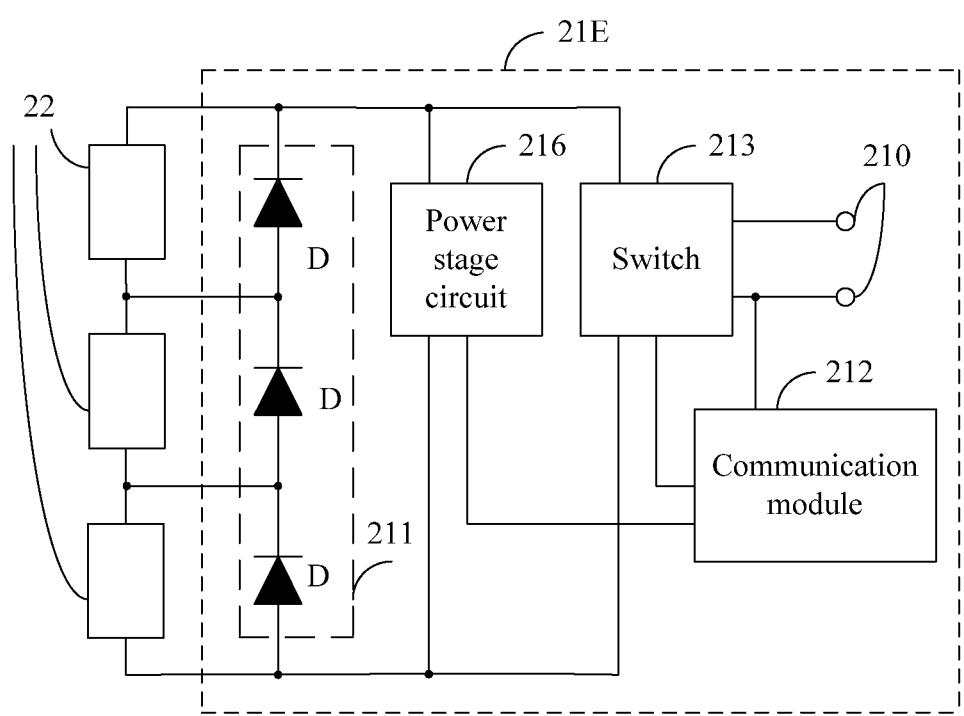
FIG. 7 is a schematic diagram of a fourth embodiment of a junction box as disclosed.

FIG. 7 is a schematic diagram of a fourth embodiment of a junction box 21E. In one embodiment, the junction box 21E has similar structures to that of FIGS. 3 to 6, and further includes a power stage circuit 216. The power stage circuit 216 is connected to the diode string 211 and the plurality of solar cell panels 22, and converts the DC power of the plurality of solar cell panels 22 into DC power suitable for driving the communication modules 212 and 212D and the detection module 214. For example, if the junction box 21E has similar structures to that of FIG. 3(a), the power stage circuit 216 is connected to the diode string 211 and the communication module 212, and converts the DC power of the plurality of solar cell panels 22 into DC power suitable for driving the communication module 212.

If the junction box 21E has similar structures to that of FIG. 6, the power stage circuit 216 is connected to the diode string 211, the communication module 212D and the detection module 214, and converts the DC power of the plurality of solar cell panels 22 into DC power suitable for driving the communication module 212D and the detection module 214. For example, if the DC power of the plurality of solar cell panels 22 is about 38V, and a working voltage of the communication module 212 is about 5V, the power stage circuit 216 includes a converter circuit, a buck transformer, and a rectifier circuit to convert the DC power of 38V into DC power of 5V.

The foregoing disclosure of various embodiments has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto and their equivalents.

What is claimed is:

1. A junction box, connected to a plurality of solar cell panels connected in series and under control of a control device, the junction box comprising:
    a plurality of diodes, forwardly connected in series to form a diode string with two ends, wherein each of the plurality of diodes is electrically connected to a corresponding one of the plurality of solar cell panels in parallel;
    two ports respectively connected to the two ends of the diode string and the plurality of solar cell panels, to output DC power of the plurality of solar cell panels;
    a switch connected between the diode string and the two ports; and
    a communication module connected to the switch, to receive control signals from the control device via the two ports to turn on or off the switch to control the two ports to output the DC power of the solar cell panels;
    wherein the communication module receives no control signals from the control device, the junction box does not output the DC power of the solar cell panels.

2. The junction box of claim 1, wherein the switch is connected between one of the two ends of the diode string and a corresponding one of the two ports.

3. The junction box of claim 2, wherein the communication module turns on the switch according to the control signals to output the DC power of solar cell panels from the two ports.

4. The junction box of claim 1, wherein the switch is connected to the diode string in parallel.

5. The junction box of claim 4, wherein the communication module turns off the switch according to the control signals to output the DC power of the plurality of solar cell panels from the two ports.

* * * * *